(12) United States Patent
DeLaCruz (10) Patent No.: US 10,018,670 B2
(45) Date of Patent: Jul. 10, 2018

(54) WIRELESS PROBES

(71) Applicant: eSilicon Corporation, San Jose, CA (US)

(72) Inventor: Javier DeLaCruz, Summit, NJ (US)

(73) Assignee: eSilicon Corporation, San Jose, CA (US)

( * ) Notice: Subject to any disclaimer, the term of this patent is extended or adjusted under 35 U.S.C. 154(b) by 129 days.

(21) Appl. No.: 14/963,076

(22) Filed: Dec. 8, 2015

(65) Prior Publication Data

US 2016/0161554 A1 Jun. 9, 2016

Related U.S. Application Data

(60) Provisional application No. 62/089,099, filed on Dec. 8, 2014.

(51) Int. Cl.
*G01R 31/302* (2006.01)
*G01R 31/303* (2006.01)

(52) U.S. Cl.
CPC ........ *G01R 31/303* (2013.01); *G01R 31/3025* (2013.01)

(58) Field of Classification Search
CPC ........ G01R 1/04; G01R 1/07; G01R 31/2648; G01R 31/2808; G01R 31/302; G01R 31/303; G01R 31/307; G01R 31/312
See application file for complete search history.

(56) References Cited

U.S. PATENT DOCUMENTS

| | | | |
|---|---|---|---|
| 7,880,490 B2 * | 2/2011 | Lee | G01R 31/3025 324/750.3 |
| 2005/0174131 A1 * | 8/2005 | Miller | G01R 1/0491 324/750.3 |

* cited by examiner

*Primary Examiner* — Tung X Nguyen
(74) *Attorney, Agent, or Firm* — Fenwick & West LLP (57) ABSTRACT

Disclosed is a probe card for testing a wireless module on an integrated circuit die contained on a wafer. The probe card includes a connector and a plurality of probes. The connector connects the probe card to test equipment. The plurality of probes connects the probe card to a wafer containing a plurality of integrated circuit dies. The probe card additionally includes an antenna configured to transmit a wireless test signal to be received by at least one of the integrated circuit dies, and/or to receive a wireless signal transmitted by at least one of the integrated circuit dies.

20 Claims, 6 Drawing Sheets

WIRELESS PROBES

CROSS REFERENCE TO RELATED APPLICATIONS

This application claims the benefit of U.S. Provisional Application No. 62/089,099, filed Dec. 8, 2014, which is incorporated by reference in its entirety.

BACKGROUND

1. Field of the Invention

This invention relates generally to testing of a wireless transceiver of an integrated circuit.

2. Description of the Related Art

Modern integrated circuit dies may include embedded wireless receivers, transmitters, and/or transceivers. Conventionally, the testing of embedded wireless modules (meaning: receivers, transmitters, and/or transceivers) is done after packaging of the integrated circuit die. However, the manufacturer of the integrated circuit may want to know if there are any defective circuits earlier in the manufacturing process. For instance, the manufacturer may be able to fix some defects to increase the yield of the manufacturing process, or may discard the defective dies before they are packaged, reducing the cost of the manufacturing process.

Thus, there is a need for testing of wireless modules before the packaging of the integrated circuit including the wireless module.

SUMMARY

The present invention overcomes the limitations of the prior art by using a probe card that includes a wireless module. The wireless probe card may probe an integrated circuit die and send signals to the die to either receive or transmit a wireless signal. The probe card then receives wireless signals sent by the integrated circuit die, or transmits wireless signals to be received by the integrated circuit die. A determination whether the integrated circuit die is defective can then be made based on the behavior of the integrated circuit die.

In one embodiment, the wireless probe card includes a housing, a connector disposed on the housing and a plurality of probes protruding from the housing. The connector connects the probe card to a test equipment. The plurality of probes connects the probe card to one or more integrated circuit dies. The probe card additionally includes an antenna configured to transmit a wireless signal to be received by at least one of the one or more integrated circuit dies, and/or to receive a wireless signal sent by at least one of the one or more integrated circuit dies.

Other aspects include components, devices, systems, improvements, methods, processes, applications and other technologies related to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Figure 1:
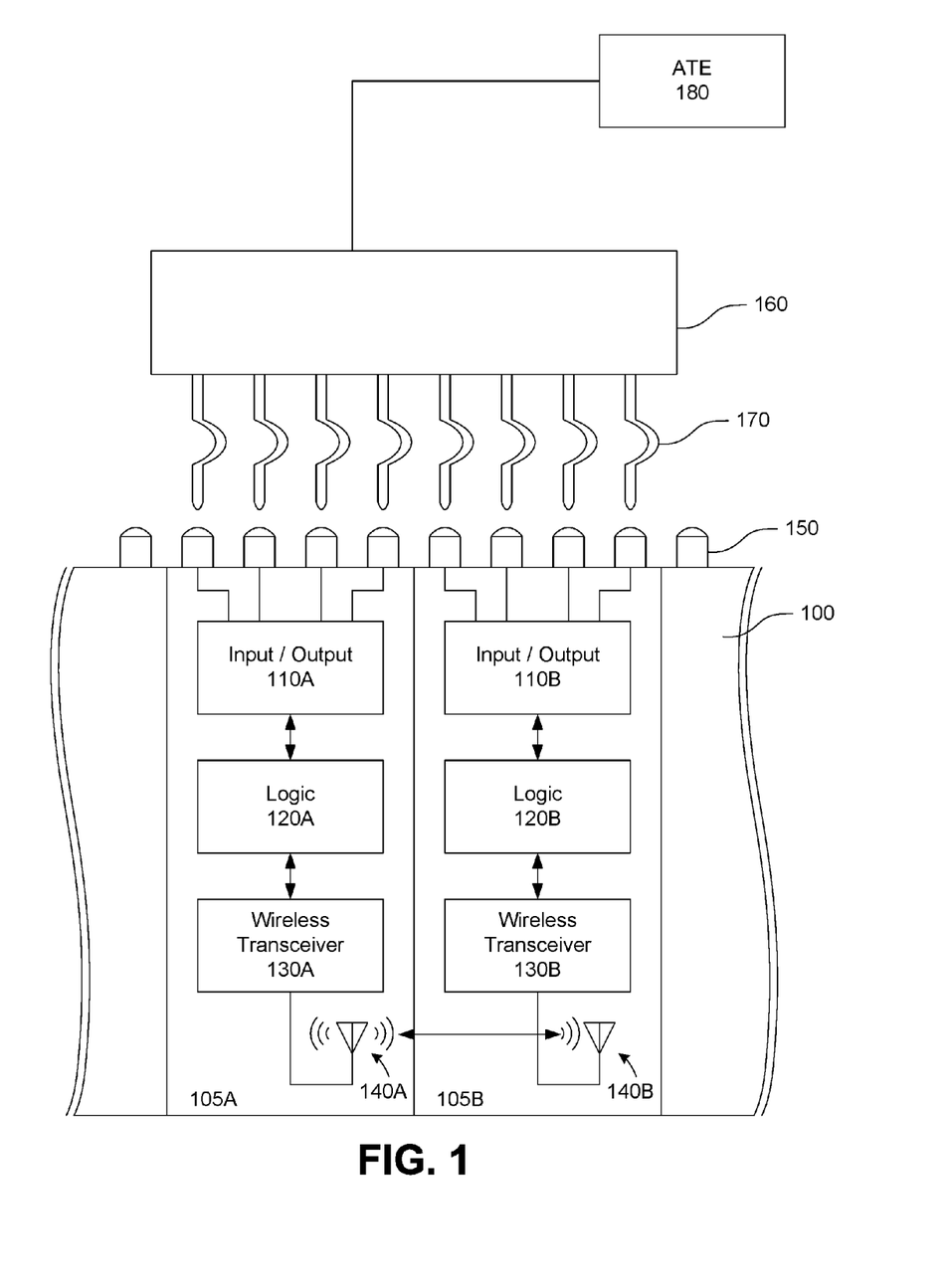
FIG. 1 is a cross sectional side view of a setup for testing integrated circuits with embedded wireless transceivers and antennas, according to one embodiment of the invention.

FIG. 1 is a block diagram of a setup for testing an integrated circuit that includes a wireless transceiver and antenna, according to one embodiment. In this setup, a silicon wafer 100 is being probed with probe card 160. The silicon wafer 100 contains multiple dies 105. Each die 105 includes multiple bumps 150 that are used to provide a wired electrical interface to the die 105.

Probe card 160 includes multiple probe tips 170 to interface with bumps 150. The probe card is also connected to automatic testing equipment (ATE) 180. ATE 180 is configured to send test signals to dies 105 through probe card 160 and to receive output signals from dies 105 through probe card 160. ATE 180 determines whether a received output signal from a die 105 is of an expected value and determines whether the die 105 is defective.

Bumps 150 may be coupled to an input/output block 110. The input output block 110 may, for example, contain input and/or output buffers. The input output block 110 is coupled to a logic block 120. Logic block 120 includes circuitry to perform different operations. Logic block 120 is also coupled to wireless transceiver 130. Wireless transceiver 130 receives signals from logic block 120 and wirelessly transmits the signals using antenna 140.

Figure 2:
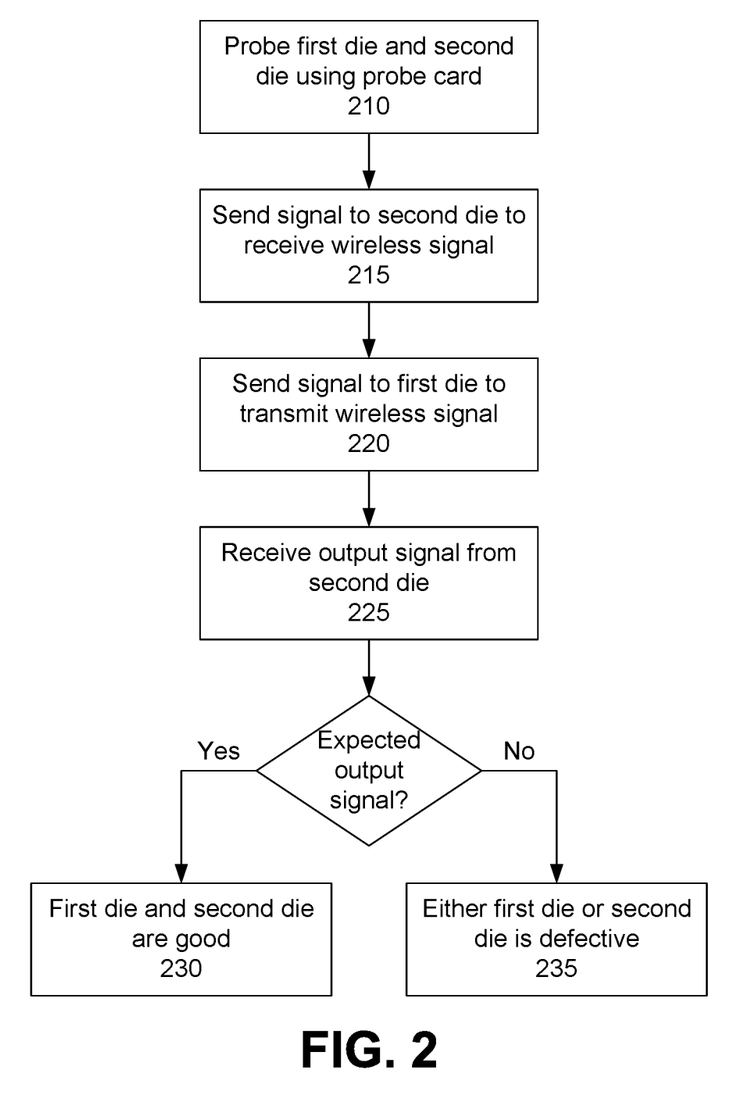
FIG. 2 is a flow diagram for testing the first die and the second die, according to one embodiment

During testing of dies 105 of silicon wafer 100, at least two dies 105A and 105B are probed using probe card 160. In some embodiments, a single die that includes two transceivers or a single die that includes a transmitter and a receiver is probed using probe card 160. FIG. 2 is a flow diagram for testing the first die 105A and the second die 105B, according to one embodiment. In this example, the signal path for testing is from the probe card 160 through probe tips 170 to die 105A to die antenna 140A through a wireless channel to die antenna 140B to die 105B through probe tips 170 back to probe card 160. The first die 105A and the second die 105B are probed 210 using the probe tips 170 of probe card 160.

A signal is sent 215, by ATE 180 through probe tips 170 of probe card 160, to second die 105B to receive the wireless signal through antenna 140B. A signal is sent 220, by ATE 180 through probe tips 170 of probe card 160, to the first die 105A to cause the wireless transceiver 130A to send a signal to antenna 140A to transmit a wireless signal. For instance, ATE 180 may send a test pattern to be sent by antenna 140A. The test pattern may include a sequence of bits to be encoded by wireless transceiver 130A and sent to antenna 140A by wireless transceiver 130A for transmission. In other embodiments, ATE 180 sends a signal to die 105A to generate a known pattern. For instance, ATE 180 may send a signal to die 105A and logic 120A may generate a test pattern based on the signal sent by ATE 180.

A wireless signal is thus transmitted by the first die 105A using antenna 140A and received by the second die 105B using antenna 140B. The wireless signal may then be processed by the wireless transceiver 130B and sent to logic block 120B. For instance, wireless transceiver 130B may decode the wireless signal received by antenna 140B, which was previously encoded by wireless transceiver 130A. Logic block 120B may further process the signal and send an output signal through the input/output block 110B to the probe card 160 via the probe tips 170.

Probe card 160 then receives 225 the output signal and sends the signal to ATE 180. ATE 180 processes the received output signal and determines whether the expected signal was received. For instance, ATE 180 may compare the received output signal to the test pattern sent to die 105A for transmission.

If the expected output signal is not received, ATE 180 determines 235 that either die 105A or die 105B (or both) are defective. Otherwise, if the expected output signal is received, ATE 180 determines 230 that both the first and the second die 105A, 105B are good.

Figure 3:
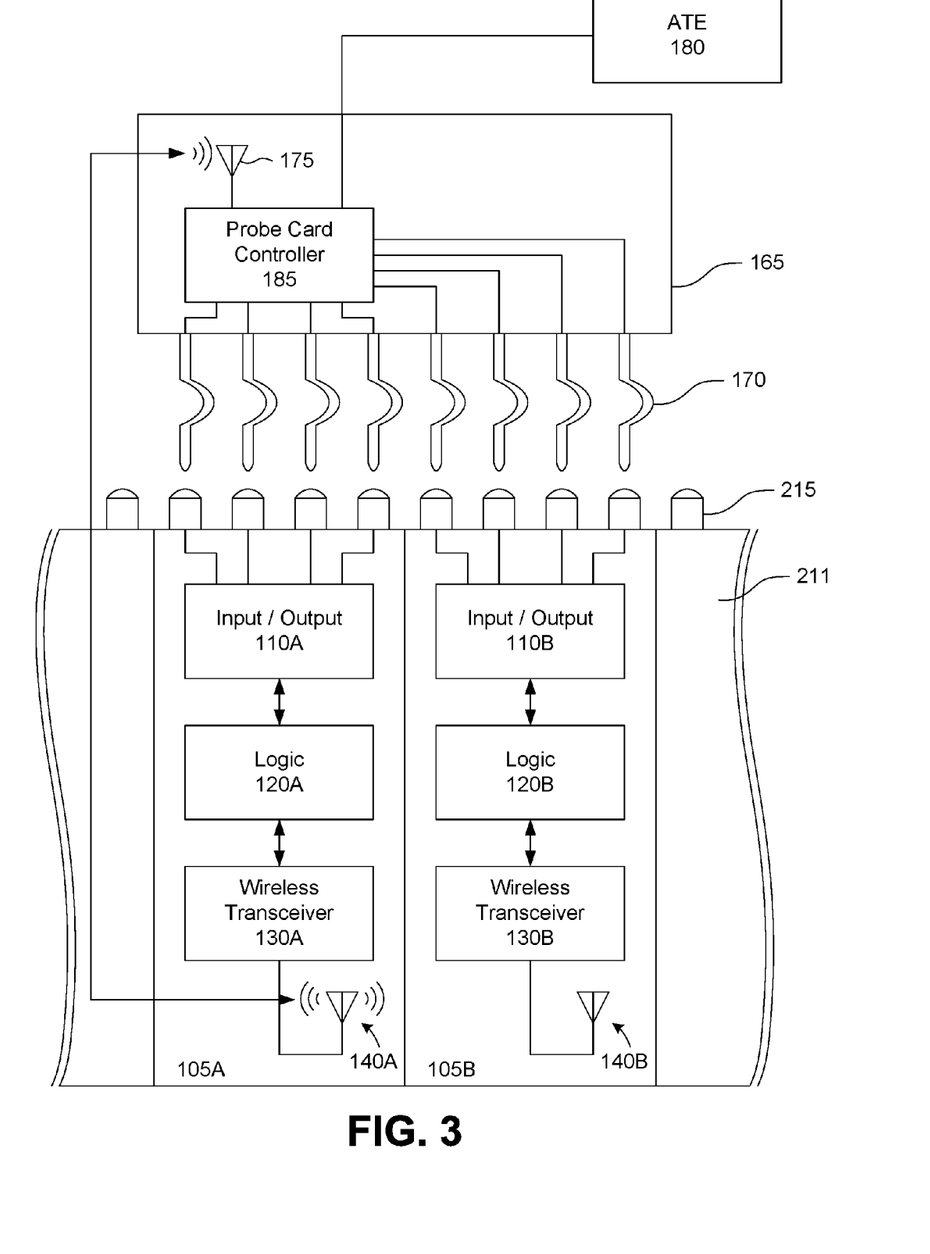
FIG. 3 is a cross sectional side view of a setup for testing integrated circuits with embedded wireless transceivers and antennas, according to another embodiment of the invention.

FIG. 3 is a block diagram of a setup for testing an integrated circuit that includes a wireless transceiver and antenna, according to another embodiment. In this setup, the probe card 165 includes an antenna 175, which can then communicate wirelessly with the antennae 140 on the dies 105. The probe card 165 may also include a probe card controller 185. Probe card controller may for example include circuitry to transmit and receive wireless signals through antenna 175. For instance probe card controller may include a wireless transceiver to encode and decode wireless signals compatible to the encoding scheme used by wireless transceivers 130A and 130B of dies 105A and 105B.

In some embodiments, the antenna 175 is located inside the body of the probe card 165. For instance, antenna 175 may be printed in a circuit board of the probe card 165. In other embodiments, the antenna 175 is disposed on an inner or outer surface of the body of the probe card 165.

Figure 4:
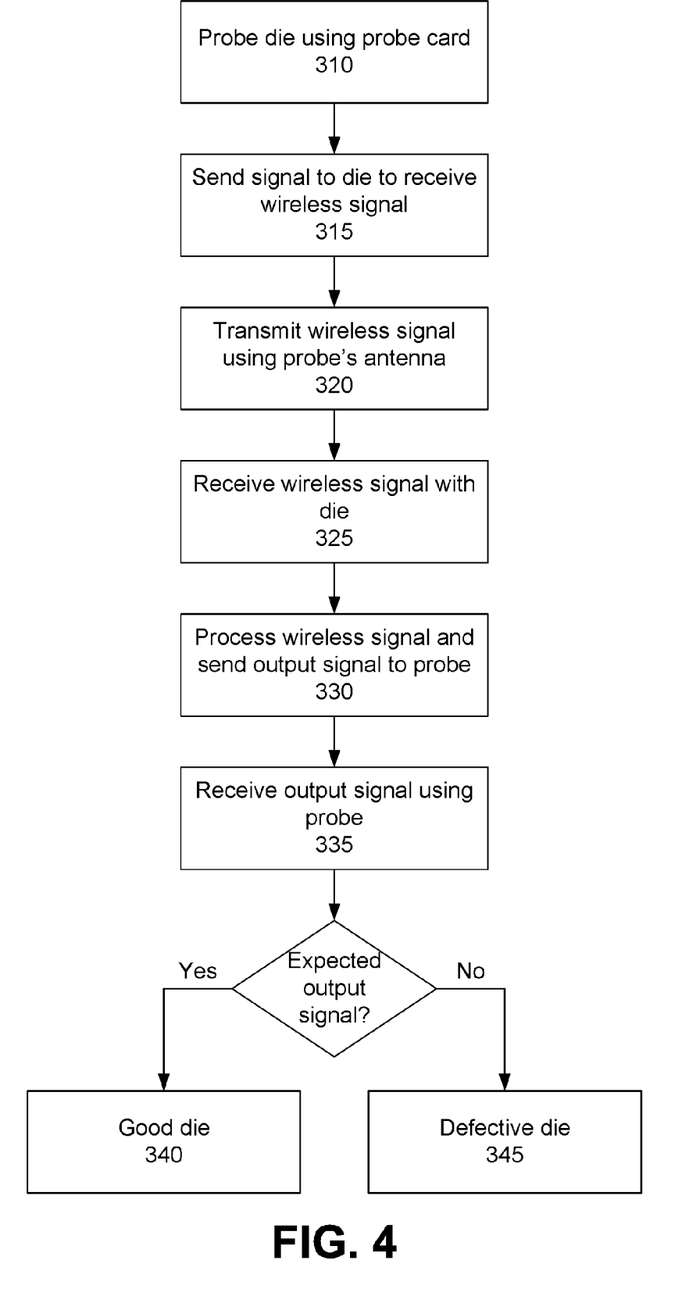
FIG. 4 is a flow diagram for testing a receiver of a die, according to one embodiment.

FIG. 4 is a flow diagram for testing a receiver of a die, according to one embodiment. In this example, the signal path for testing flows from probe card 165 to probe card antenna 175 to die antenna 140 and back through probe tips 170 to the probe card 165. A die 105 is probed 310 using probe card 165. In some embodiments multiple dies may be tested in parallel. For instance, the wireless signal transmitted by probe antenna 175 may be received by multiple die antennae 140A, 140B of multiple dies 105A, 105B.

A signal is sent 315 via the probe tips to the die 105 to receive a wireless signal. The probe card 165 transmits 320 a wireless signal using antenna 175. For instance, ATE 180 may send an encoded signal to be directly transmitted by probe antenna 175. Alternatively, ATE 180 may send a digital test pattern to be encoded by probe card controller 185 and subsequently sent by probe antenna 175. In another example, ATE 180 may send a signal to probe card 165 to generate a test pattern. For instance, probe card controller 185 may include logic to generate a test pattern based on a signal received from ATE 180. The probe card controller 185 may further encode the generated test pattern and send the encoded test pattern through antenna 175.

Die 105A receives 325 the wireless signal using antenna 140. The die 105 may process the wireless signal and sends 330 an output signal via the probe tips to the probe card 165. For instance, the wireless transceiver 130A may decode the wireless signal received by die antenna 140A and logic 120A may further process the decoded signal.

Probe card 160 then receives 335 the output signal and sends the signal to ATE 180. ATE 180 processes the received output signal and determines whether the expected signal was received. If the expected output signal is not received, ATE 180 determines 345 that the die 105 is defective. Otherwise, if the expected output signal is received, ATE 180 determines 340 the die 105 is good.

Figure 5:
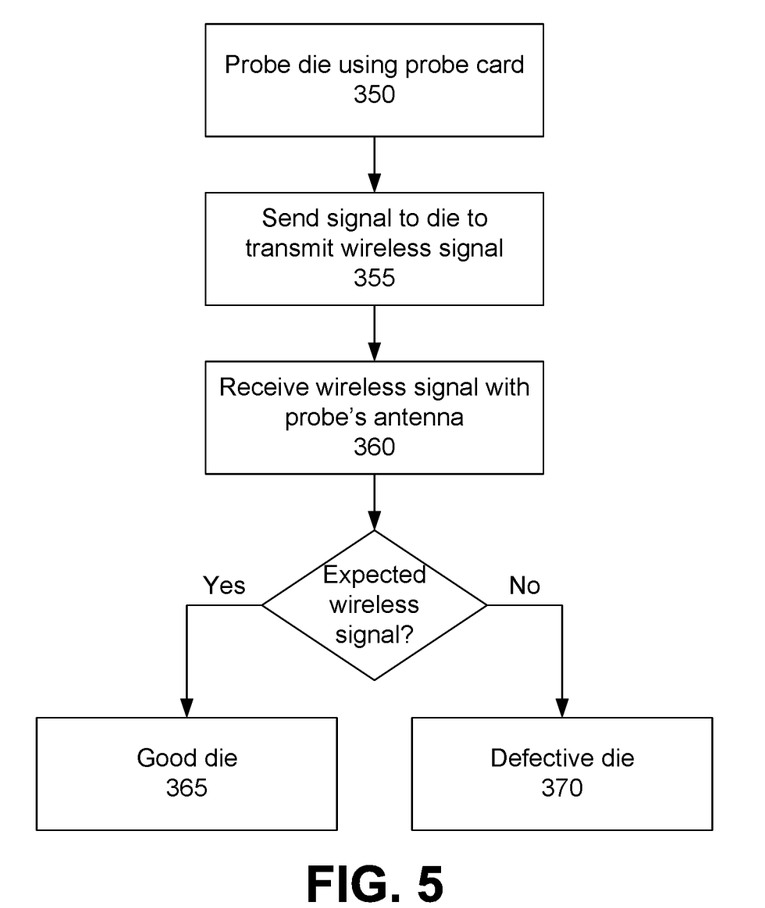
FIG. 5 is a flow diagram for testing a transmitter of a die, according to one embodiment.

FIG. 5 is a flow diagram for testing a transmitter of a die, according to one embodiment. In this example, the signal path for testing flows from probe card 165 through probe tips 170 to die 105 to die antenna 140 through a wireless channel to probe card antenna 175. A die 105 is probed 350 using probe card 165. A signal is sent 355 via probe tips 170 to the die 105 to transmit a wireless signal. The die receives the signal and transmit the wireless signal using antenna 140. The probe card 165 receives 360 the wireless signal using antenna 175.

Probe card 165 may process the wireless signal and send an output signal to ATE 180. ATE 180 processes the received output signal and determines whether the expected signal was received. If the expected output signal is not received, ATE 180 determines 370 that the die 105 is defective. Otherwise, if the expected output signal is received, ATE 180 determines 365 the die 105 is good.

During testing of die 105A of silicon wafer 100, a signal is supplied to a first die 105A to cause the wireless transceiver 130A to send a signal to antenna 140A to transmit a wireless signal. The wireless signal is received by the probe card 165 via antenna 175. The received signal is then processed by probe card controller 185 and sent to ATE 180. ATE 180 processes the received output signal and determines whether the expected signal was received. If the expected signal is not received, ATE 180 determines that die 105A is defective.

Alternatively, during testing of die 105A of silicon wafer 100, a wireless signal is transmitted by probe card 165 via antenna 175. At the same time, a signal is supplied to die 105A to receive the wireless signal through antenna 140A. The wireless signal may then be processed by the wireless transceiver 130A and sent to logic block 120A. Logic block 120A may further process the signal and send an output signal through the input/output block 110A to the probe card 165.

Probe card 165 may then receive the output signal and send the signal to ATE 180. ATE 180 processes the received output signal and determines whether the expected signal was received. If the expected signal is not received, ATE 180 determines that die 105A is defective.

In some embodiments, multiple dies 105 may be tested in parallel. For instance, a wireless signal may be transmitted by probe card 165. The wireless signal may be received by both dies 105A and 105B in parallel. Each die 105A and 105B sends a respective output signal to probe 165 and ATE 180 determines whether a die under test is defective.

In other embodiments, the wireless signal is multiplexed to test multiple dies 105. For instance, time division multiplexing (TDM) may be used to test dies 105A and 105B. During a first testing period, a first wireless signal is transmitted from the probe card via antenna 175. A signal is sent to the first die via probe tips 170 to receive and process the first wireless signal. Then, during a second testing period, a second wireless signal is transmitted from the probe card via antenna 175. A signal is also sent to the second die via probe tips 170 to receive and process the second wireless signal.

Other multiplexing schemes may also be used to test multiple dies 105. For instance, code division multiple access (CDMA), frequency division multiplexing (FDM), orthogonal frequency division multiplexing (OFDM), and the like may be used.

In some embodiments, die 105 has an embedded transceiver, but does not have an antenna to transmit and/or receive a wireless signal. In that case, die 105 may use an external antenna to transmit and/or receive wireless signals. In this embodiment, as illustrated in FIG. 6, the probe card may include one or more antennae 190 that can be connected one or more dies to allow the dies 105 to transmit and/or receive wireless signals.

Figure 6:
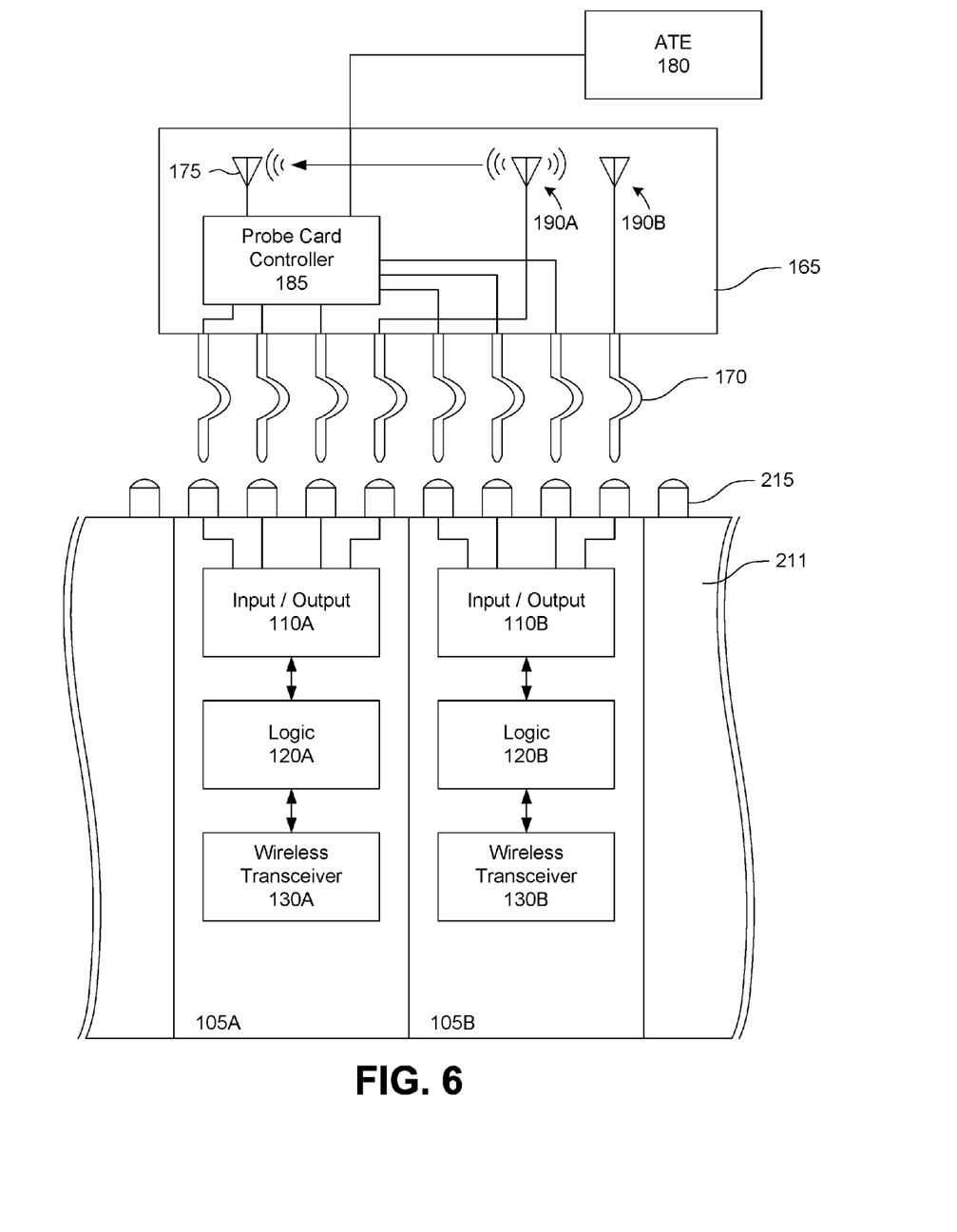
FIG. 6 is a cross sectional side view of a setup for testing integrated circuits with embedded wireless transceivers and antennas, according to another embodiment of the invention.

As illustrated in FIG. 6, probe card 165 includes a probe card antenna 175, one or more die antennae 190. Optionally, probe card 165 includes a probe card controller 185.

In one embodiment, the signal path for testing the receiving capabilities of die 105A flows from probe card 165 to probe card antenna 175 to die antenna 190A located in the probe card. The signal then travels into die 105 through a probe tip 170 connected to the antenna. The signal may then be decoded by wireless transceiver 130A and/or processed by logic 120A. The signal is sent back to probe card 165 though probe tips 170. The signals received from die 105A by probe card 165 are then sent to ATE 180 for determining whether die 105A is defective.

Additionally, the signal path for testing the transmitting capabilities of die 105A flows from probe card 165 to die 105A through probe tips 170. The signal may then be processed by logic 120A and/or encoded by wireless transceiver 130A and sent to a die antenna 190A of probe card 165 through probe tip 170. The die antenna 190A of probe card 165 transmits a wireless signal which is then received by probe card antenna 175. The wireless signal is optionally processed by probe card controller 185. The signal is then sent to ATE 180 for determining whether die 105A is defective.

In other embodiments, the signal path for testing dies 105A and 105 flows from probe card 165 to die 105A though probe tips 170. The signal may then be processed by logic 120A and/or encoded by wireless transceiver 130A for wireless transmission. The signal is then sent back to probe card 165 through a probe tip 170 to die antenna 190A. Die antenna 190A wirelessly send the signal and die antenna 190B receives the wireless signal. The signal received by antenna 190B is then sent to die 105B though a probe tip 170. The received signal is decoded by wireless transceiver 130B and/or processed by logic 120B. The signal is then sent back to probe card 165 through probe tips 170. The signal is then sent to ATE 180 for determining whether die 105A is defective.

Although the detailed description contains many specifics, these should not be construed as limiting the scope of the invention but merely as illustrating different examples and aspects of the invention. It should be appreciated that the scope of the invention includes other embodiments not discussed in detail above. Various modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. A probe card for testing a wireless module on an integrated circuit die contained on a wafer, the probe card comprising:
    a housing;
    a connector disposed on the housing, the connector for connecting the probe card to test equipment;
    a plurality of probes to probe a wafer containing a plurality of integrated circuit dies, the plurality of probes protruding from the housing; and
    an antenna configured to transmit a wireless test signal to be received by at least one of the integrated circuit dies, and/or to receive a wireless signal transmitted by at least one of the integrated circuit dies.

2. The probe card of claim 1, further comprising a housing, wherein the antenna is disposed on the surface of the housing of the probe card.

3. The probe card of claim 1, further comprising:
    a probe card controller configured to transmit input signals to the integrated circuit dies via the probes, and/or to receive output signals from the integrated circuit dies via the probes, and to transmit and/or receive wireless signals via the antenna.

4. The probe card of claim 3, wherein the probe card controller comprises a wireless module for encoding a test pattern to be transmitted via the antenna, and/or to decode a signal received via the antenna.

5. The probe card of claim 3, wherein the probe card controller generates a test pattern to be transmitted via the antenna based on a signal received through the connected from the test equipment.

6. The probe card of claim 4, wherein the antenna is coupled to the probe card controller.

7. The probe card of claim 1, wherein the antenna is coupled to a probe of the plurality of probes.

8. The probe card of claim 1, further comprising:
    a second antenna, the second antenna coupled to the connector, the at least one of the integrated circuit dies configured to transmit the wireless signal to be received by the antenna of the probe card via the second antenna, the wireless test signal transmitted by the second antenna based on a signal received by an integrated circuit die of the plurality of dies of the wafer.

9. The probe card of claim 1, further comprising:
    a second antenna, the second antenna coupled a probe of the plurality of probes, the at least one of the integrated circuit dies configured to receive the wireless test signal transmitted by the antenna of the probe card via the second antenna.

10. The probe card of claim 1, wherein the wireless test signal is received by the at least one of the integrated circuit dies via an antenna embedded in the at least one of the integrated circuit dies.

11. The probe card of claim 1, wherein the wireless signal is transmitted by the at least one of the integrated circuit dies via an antenna embedded in the at least one of the integrated circuit dies.

12. A method for testing an integrated circuit die comprising:
   probing the integrated circuit die using a probe card, the probe card including a probe card antenna;
   sending a signal to the integrated circuit die to receive a wireless signal;
   transmitting a wireless signal using the antenna of the wireless probe card, the transmitted wireless signal to be received by an antenna of the integrated circuit die;
   receiving an output signal from the integrated circuit die; and
   determining whether the integrated circuit die contains defects based on the received output signal.

13. The method of claim 12, wherein determining whether the integrated circuit die contains defects based on the received output signal comprises:
   comparing the received output signal to an expected output generated based on the transmitted wireless signal.

14. The method of claim 12, wherein determining whether the integrated circuit die contains defects based on the received output signal comprises:
   comparing the received output signal to the transmitted wireless signal.

15. The method of claim 12, further comprising:
   sending a second signal, via the prove card, to the integrated circuit die to transmit a second wireless signal;
   receiving the second wireless signal, using the wireless probe antenna, from the integrated circuit die; and
   determining whether the integrated circuit die contains defects based on the received second wireless signal.

16. The method of claim 12, further comprising:
   probing a second integrated circuit die using the probe card;
   sending a signal to the integrated circuit die to receive a wireless signal;
   sending a signal to the second integrated circuit die to transmit the wireless signal;
   receiving an output signal from the first integrated circuit die; and
   determining whether the first integrated circuit die and the second integrated circuit die contain defects based on the received output signal.

17. A probe card for testing a wireless module on an integrated circuit die contained on a wafer, the probe card comprising:
   a connector for connecting the probe card to test equipment;
   a plurality of probes to probe a wafer containing a plurality of integrated circuit dies; and
   an antenna configured to transmit a wireless test signal to be received by at least one of the integrated circuit dies, and/or to receive a wireless signal transmitted by at least one of the integrated circuit dies.

18. The probe card of claim 17, further comprising a housing, wherein the antenna is embedded inside the housing of the probe card.

19. The probe card of claim 17, further comprising:
   a second antenna, the second antenna coupled to the connector, the at least one of the integrated circuit dies configured to transmit the wireless signal to be received by the antenna of the probe card via the second antenna, the wireless test signal transmitted by the second antenna based on a signal received by an integrated circuit die of the plurality of dies of the wafer.

20. The probe card of claim 17, further comprising:
   a second antenna, the second antenna coupled a probe of the plurality of probes, the at least one of the integrated circuit dies configured to receive the wireless test signal transmitted by the antenna of the probe card via the second antenna.

* * * * *

UNITED STATES PATENT AND TRADEMARK OFFICE
CERTIFICATE OF CORRECTION

PATENT NO. : 10,018,670 B2
APPLICATION NO. : 14/963076
DATED : July 10, 2018
INVENTOR(S) : Javier DeLaCruz It is certified that error appears in the above-identified patent and that said Letters Patent is hereby corrected as shown below:

In the Claims

In Column 6, Line(s) 25, Claim 1, delete "to test equipment" to read as --to a test equipment--

In Column 6, Line(s) 33-34, Claim 2, delete "The probe card of claim 1, further comprising a housing, wherein" to read as --The probe card of claim 1, wherein--

In Column 6, Line(s) 48-49, Claim 5, delete "through the connected from the test equipment" to read as --through the connector from the test equipment--

In Column 7, Line(s) 34-35, Claim 15, delete "prove card" to read as --probe card--

In Column 8, Line(s) 35-36, Claim 20, delete "the second antenna coupled a probe" to read as --the second antenna coupled to a probe--

Signed and Sealed this
Twentieth Day of August, 2019

Andrei Iancu
*Director of the United States Patent and Trademark Office*